United States Patent [19]

Takahashi et al.

[11] Patent Number: 4,758,686

[45] Date of Patent: Jul. 19, 1988

[54] ELECTROMAGNETIC SHIELD STRUCTURE FOR BUILDING WINDOWS

[75] Inventors: Takeshi Takahashi; Masatake Nakamura; Yoshiji Yabana; Toshiyuki Ishikawa; Koji Nagata, all of Tokyo, Japan

[73] Assignee: Shimizu Construction Co., Ltd., Tokyo, Japan

[21] Appl. No.: 52,647

[22] Filed: May 20, 1987

[51] Int. Cl.$^4$ .............................................. H05K 9/00
[52] U.S. Cl. .............................................. 174/35 MS
[58] Field of Search ........................... 52/171, 204, 63; 174/35 R, 35 MS, 35 GC

[56] References Cited

U.S. PATENT DOCUMENTS

| | | | |
|---|---|---|---|
| 3,177,334 | 4/1965 | Kinkle | 174/35 MS |
| 3,801,418 | 4/1974 | Cornelis | 52/171 |
| 4,613,530 | 9/1986 | Hood | 52/171 |

*Primary Examiner*—John E. Murtagh
*Attorney, Agent, or Firm*—Armstrong, Nikaido, Marmelstein & Kubovcik

[57] ABSTRACT

In a building in which electromagnetic shielding members are used in a body of the building and at openings such as windows, entrances and exits to provide the overall building with electromagnetic shielding, a window glass and a window frame are each provided with an electromagnetic shielding body formed so as to be electrically integrated with a grounded connection of a building structure. This enables the window openings to be provided with an electromagnetic shielding effect through simple construction work irrespective of the structure, shape and material of the window opening. Further, an earth bond is obtained between a sash frame and iron rods for reinforcing the concrete of the building body. This makes it possible to ground the sash frame in a simple manner without exposing it, and to obtain an electromagnetic shielding effect, merely by providing the earth bond between the reinforcing rods and sash frame before the concrete is poured.

8 Claims, 6 Drawing Sheets

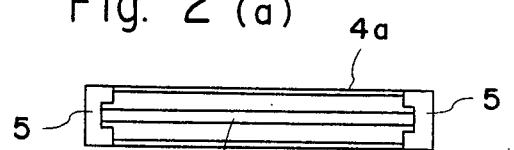
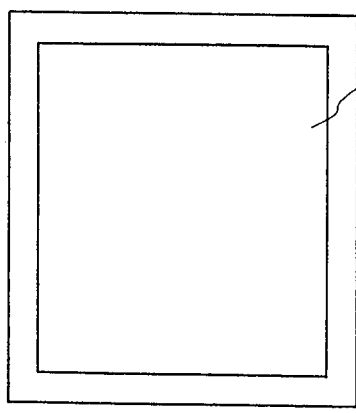 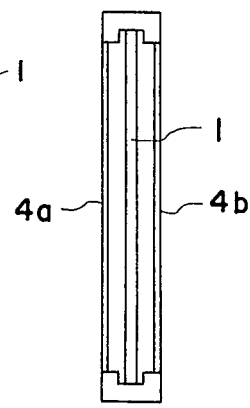

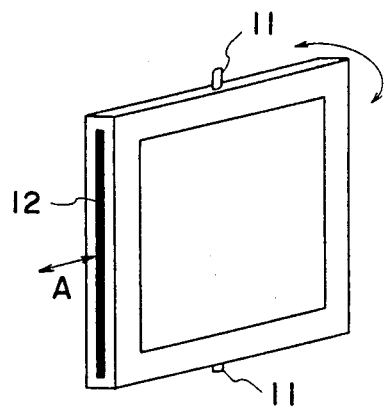
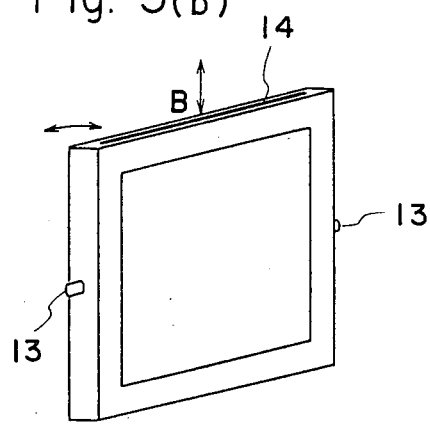
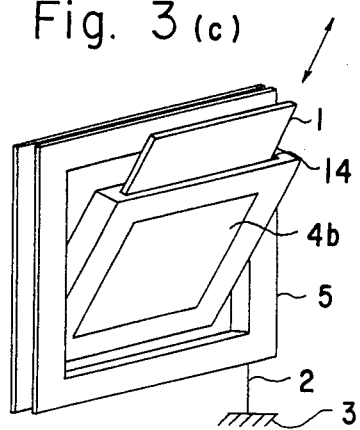

Fig. 4 (a)
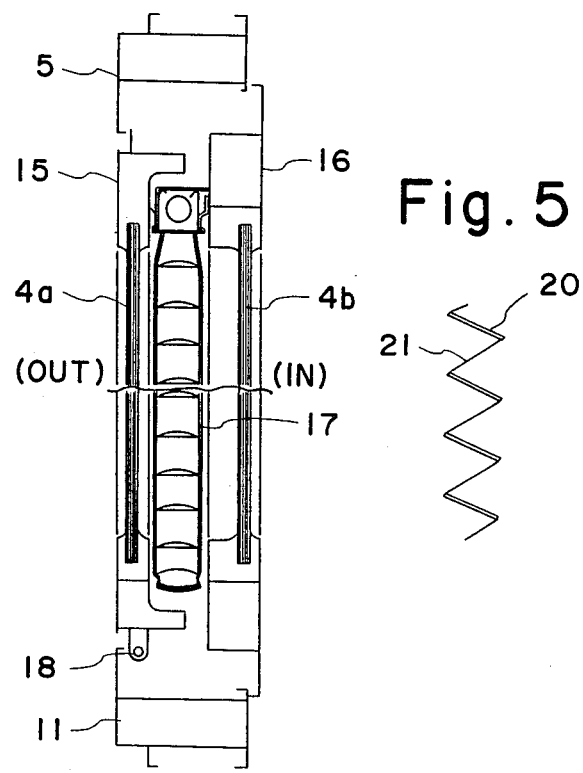
Fig. 5
Fig. 4 (b)
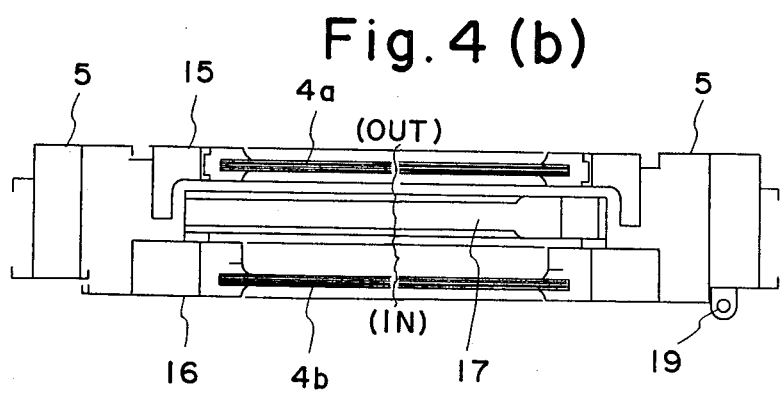

ELECTROMAGNETIC SHIELD STRUCTURE FOR BUILDING WINDOWS

BACKGROUND OF THE INVENTION

This invention relates to a building having an electromagnetic shield structure well-suited for application to an information network system utilizing electric waves, and more particularly to an electromagnetic shield structure for shielding electromagnetic waves at a window opening of a building.

In many modern buildings, information generally is communicated between the interior and the outside of the building by making joint use of information communicating equipment such as multiple electronic exchanges and computers. With the increasing value of information, diversification of user needs and increasingly individual nature thereof, the amount of information involved in such communication is growing. Under these circumstances, how to transmit the necessary information rapidly and at low cost where large-scale buildings are involved has become of prime importance. In an effort to satisfy this need, data highway-type information networks utilizing optical fiber cables or coaxial cables have been studied and proposed.

However, with a data highway system utilizing optical fiber cables or coaxial cables, the cables must be stretched throughout all parts of the building to reach the various pieces of communication equipment, and it is necessary to provide follower ducts or a double-floored structure in order to install the cables. The time needed to complete the work and the expenses involved are significant.

If electric waves are used to transmit information within the building, laying cables is unnecessary but radio law limits the usable frequency to no more than 3 T(tera) Hz owing to the emission of electrical noise waves from such a building. Another problem is that the communication system may malfunction due to electric waves or the like from outside the building.

Accordingly, in a building of the above type, some expedient must be adopted to deal with these elecelectric waves at the window openings, entrances and exits of the building. At the window openings, for example, a mesh or some other electrically conductive material can be used in the window glass to form an electromagnetic shield in the window. However, this necessitates that the window glass mesh and window frame be reliably grounded. To accomplish this, it is necessary that the window glass be electrically connected to the window frame, and that the window frame be electrically connected to the body of the building, e.g. to a grounded part of the building structure such as the iron reinforcing rods in the building concrete. However, the amount of work involved to electrically interconnect all of the window glass panes, window frames and building body is enormous, especially for large buildings and a large number of windows.

SUMMARY OF THE INVENTION

An object of the present invention is to provide an inexpensive, simple and highly effective electromagnetic shield structure for the windows of a building.

Another object of the present invention is to provide an electromagnetic shield structure for the windows of a building in which the window frames can be grounded simply and inexpensively.

In accordance with the present invention, the foregoing objects are attained by affixing an electrically conductive film to both sides of a window opening, and integrally forming, in electrical terms, the electrically conductive film, an imbedded anchor and an electromagnetic shielding layer of the building body to achieve grounding. This makes it possible to provide the window opening with an electromagnetic shielding function, through simple construction work, irrespective of the structure, configuration and materials of the window opening. In addition, shattering of the window glass can be prevented by affixing the electrically conductive film to both surfaces of the glass.

In accordance with another embodiment of the invention, a shielding body is fitted between the panes of a double-glazed window to afford flexibility in terms of modifying the specifications and frequency used. By installing the shielding body, an arrangement can be adopted in which the shielding body and window frame are electrically connected, thereby assuring an electromagnetic shielding effect without bonding.

In accordance with still another embodiment of the invention, a earth bond is provided between the concrete iron reinforcing rods of the building body and a sash frame. This makes it possible to ground the sash frame in a simple manner without exposing it, and to obtain an electromagnetic shielding effect, merely by providing the earth bond between the reinforcing rods and sash frame before the concrete is poured.

In yet another embodiment of the invention, the sash of a window frame is electrically connected to the concrete iron reinforcing rods of the building body by welding and earth bonding, thereby providing excellent conductivity and enhancing the effectiveness of the electromagnetic shield. Since the concrete iron reinforcing rods of the building body are used and it is unnecessary to lay grounding wires in a separate system, the work is easy to perform and an attractive external appearance can be maintained since grounding wires are not exposed to view.

In a further embodiment of the invention, a window glass is fixedly secured in a sash so as to compress a strip of electrically conductive rubber. This provides a sufficiently large contact pressure between the electromagnetic shielding layer of the window glass and the electrically conductive rubber, as well as between the electrically conductive rubber and the sash. As a result, contact resistance can be reduced and satisfactory conductivity can be obtained between the sash and the electromagnetic shielding layer of the window glass. Accordingly, it will suffice to connect this sash to a grounding circuit.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 2(a), FIG. 2(b) and FIG. 2(c) are useful in describing another embodiment of the invention, in which FIG. 2 (a) is a transverse sectional view, FIG. 2 (b) a front view and FIG. 2 (c) a longitudinal sectional view;

FIGS. 3(a), 3(b) and 3(c) are perspective views showing other embodiments of the invention;

FIGS. 4(a) and 4(b) illustrate an example incorporating blinds as an electromagnetic shielding body, in which FIG. 4(a) is a sectional view and FIG. 4(b) a plan view;

FIG. 5 is a view for describing blinds used as an electromagnetic shielding body;

DESCRIPTION OF THE PREFERRED EMBODIMENTS

Embodiments of the present invention will now be described with reference to the drawings.

Figure 1:
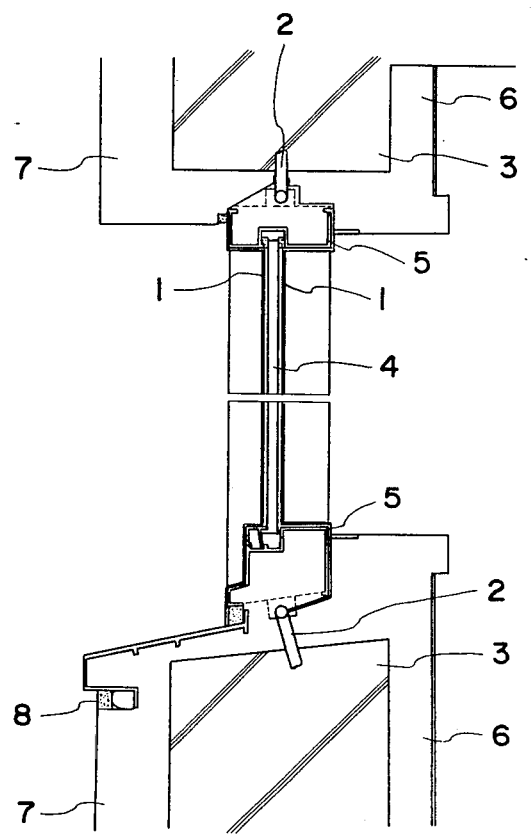
FIG. 1 is a sectional view illustrating an embodiment of an electromagnetic shielding structure for the window of a building.

In FIG. 1, a building body 3 forms an electromagnetic shielding layer using e.g. ferrite-containing concrete and conductive mesh-containing concrete. Imbedded in the building body 3 is an anchor 2 to which a sash 5 is secured. Thus, the imbedded anchor 2 is electrically integrated with the electromagnetic shielding layer of the building body 3 and is grounded through this shielding layer. An external wall finishing 7 is obtained by e.g. introducing a filling mortar and forming an external wall finishing thereon by means of tiles. An inner wall finishing 6 is obtained by e.g. introducing a filling mortar and forming an inner wall finishing thereon.

For a sash window of the above-described type, a building window structure in accordance with the invention includes an electromagnetic shielding body such as electrically conductive film 1 affixed to both surfaces of a window glass 4 and the sash 5 and electrically integrated with the imbedded anchor 2. By thus interposing the window glass and the window sash, which is provided with an insulating layer, between the electrically conductive films 1 on the inner and outer sides, the window opening is electrically integrated at both sides thereof with the anchor 2 imbedded in the electromagnetic shielding layer of the building body, thereby providing the window opening with an electromagnetic shielding effect.

It is also possible to adopt an arrangement in which only the electrically conductive film affixed to the inner side is electrically integrated with the imbedded anchor and the electrically conductive film affixed to the outer side is not so integrated but is utilized as a simple external electromagnetic shield for the window opening and as means for preventing the flying of shattered glass if the window is ever broken. This arrangement readily affords the window opening with an electromagnetic shielding effect through simple construction. In this respect the invention is very useful to improve existing buildings where external footholds are inadequate.

It should be noted that the invention is not limited to the above-described embodiment but can be modified in various ways. For example, in the above embodiment, the electrically conductive film is electrically integrated with the imbedded anchor. However, in a case where a PC curtain wall having an electromagnetic shielding function is used as the external wall finishing or an electrically conductive panel is used as the inner wall finishing, it is permissible to adopt an arrangement in which an electrically conductive film affixed to the window opening is formed so as to be electrically integrated with the outer wall or inner wall finishing and not an imbedded anchor. Furthermore, in the aforementioned embodiment, a fixed-sash window is illustrated as the type of window opening. However, it goes without saying that the invention can be applied to all types of windows irrespective of building height, building structure, such as structures for cold climates, window materials and window shape. Example of the types of windows to which the invention can be applied include sliding windows, windows in which the central portion is fixed and both sides slide, windows in which the central portion is fixed and both sides rotate about vertical shafts, windows that rotate about a vertical shaft, curtain wall windows and the like.

FIGS. 2(a), (b) and (c) illustrate another embodiment of the invention, in which FIG. 2(a) is a transverse sectional view, FIG. 2(b) a front view and FIG. 2(c) a longitudinal sectional view. In this embodiment, a window sash frame 5 is electrically integrated with the electromagnetic shielding layer of an external wall, and window glass panes 4a, 4b are superimposed in the frame and have an electromagnetic shielding body 1 fitted therebetween. The electromagnetic shielding body 1 comprises a screen made of an electrically conductive mesh or blinds using an electrically conductive film, and is fitted between the panes 4a, 4b of double glass. Owing to the resulting contact, the electromagnetic shielding body 1 is electrically integrated with the window frame to provide an electromagnetic shielding effect. FIGS. 3(a), (b) and (c) illustrates examples of the structure in which electromagnetic shielding body 1 is fitted between the double panes of window glass 4a, 4b.

In the example of FIG. 3(a), upper and lower rotary shafts 11 are provided, an electromagnetically shielded window is capable of being rotated about these shafts, and a screen or the like serving as the electromagnetic shielding body is capable of being inserted and withdrawn from a side opening 12. In the example of FIG. 3(b), rotary shafts 13 are provided at the sides, an electromagnetically shielded window is capable of being rotated about these shafts, and a screen or the like serving as the electromagnetic shielding body is capable of being inserted and withdrawn from a side opening 14. In this case, the screen is fitted into the window frame and is electrically connected thereto by contact. By thus arranging it so that the screen can be freely inserted and withdrawn, screen meshes can be exchanged depending upon the frequency band used. Moreover, if the electromagnetic shielding becomes unnecessary, the screen can be removed so that the window may be used as an ordinary double-glazed window.

FIG. 3(c) shows the electromagnetically shielded window of FIG. 3(b) rotated in sash frame 5 so that the electromagnetic shielding body 1 can be inserted or withdrawn.

FIGS. 4(a) and 4(b) illustrate an example in which blinds functioning as an electromagnetic shield are fitted between douple panes of glass, in which FIG. 4(a) is a sectional view and FIG. 4(b) a plan view, and FIG. 5 is a view for describing blinds which function as an electromagnetic shield.

In FIGS. 4(a) and 4(b), the electromagnetic shielding structure comprises a sash frame 5 secured to a wall, an outer window frame 15, an inner window frame 16, and blinds 17 constituting the electromagnetic shielding body. The outer frame 15 has a pane of glass 4a fitted therein and pivots inwardly about a lower rotary shaft 18 shown in FIG. 4(a) serving as the fulcrum. The inner frame 16 has a pane of glass 4b and the blinds 17 fitted therein and opens inwardly to the left together with the blinds 17 about a rotary shaft 19 on the right side serving as the fulcrum as shown in FIG. 4(b). Thus, the blind 17 can be inserted and withdrawn in a state where the inner frame 16 is swung open on the inner side. The blinds 17 comprise e.g. blades serving as electromagnetic shielding members, as will be described below, and the blades themselves are interconnected by electromagnetic shielding members. Accordingly, when the blinds 17 have been installed, the shielding structure of this embodiment can be utilized as a window having both a lighting adjustment function and electromagnetic shielding function. When the blinds 17 are removed, the structure serves as an ordinary double-glazed window.

In the example shown in FIG. 5, an electromagnetic shielding member (e.g. a steel plate or electrically conductive film) is used as a blade 20 of the aforementioned blinds or on the surface of the blade, and the blades 20 are interconnected by a transparent electrically conductive film 21. With this arrangement, electromagnetic shielding is effected by the surfaces of the blades 20 and transparent file 21 while lighting is adjusted by changing the angle of the blades 20. In a building which does not require electromagnetic shielding, therefore, the blinds may be used in the ordinary manner solely for lighting adjustment purposes. It should be noted that the blades 20 and transparent film 21 are electrically connected at the connection between the upper blind and window frame so as to be grounded through the window frame.

Figure 6:
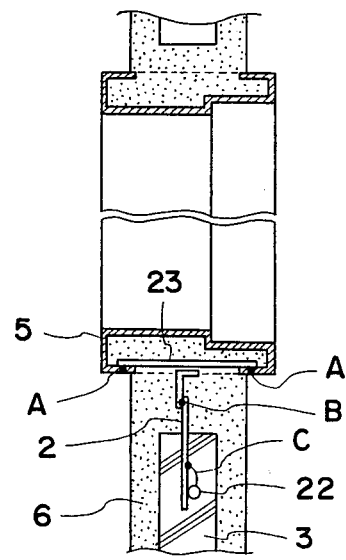
FIG. 6 is a view for describing an embodiment of a method of grounding a sash frame in a building in accordance with the invention.

FIG. 6 illustrates an example of providing an earth bond in a case where the sash frame 5 is fitted in after the concrete of the building body is poured, followed by imbedding in mortar 6. An earth bond is provided between the anchor 2 and iron rods 22 for concrete reinforcement, after which the anchor 2 is imbedded in the concrete of building body 3 by pouring the concrete. The sash frame 5 is joined to the imbedded anchor 2 by welding at several points via a sash achor 23, and this portion is imbedded in the mortar 6. Thus, the sash frame 5, sash anchor 23, imbedded anchor 2 and iron rods 22 are fully electrically interconnected so that sufficient electrical conductivity can be obtained.

Figure 7:
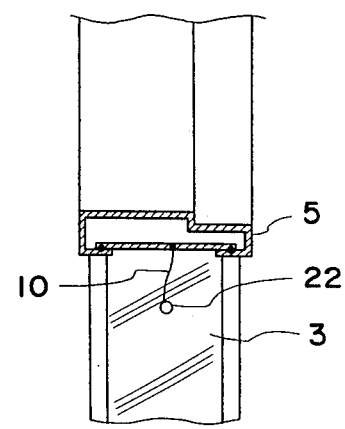
FIG. 7 is a view for describing another embodiment of a method of grounding a sash frame in a building in accordance with the invention.

FIG. 7 illustrates an example in which the concrete of the building body 3 is poured so as to directly support the sash frame 5. In this case, welding is performed to provide an earth bond from the sash frame 5 to the concrete reinforcing rods 22 of the building body 3 via a ground wire 10. It is thus possible to dispense with the imbedded anchor 2 shown in the example of FIG. 6.

Figure 8:
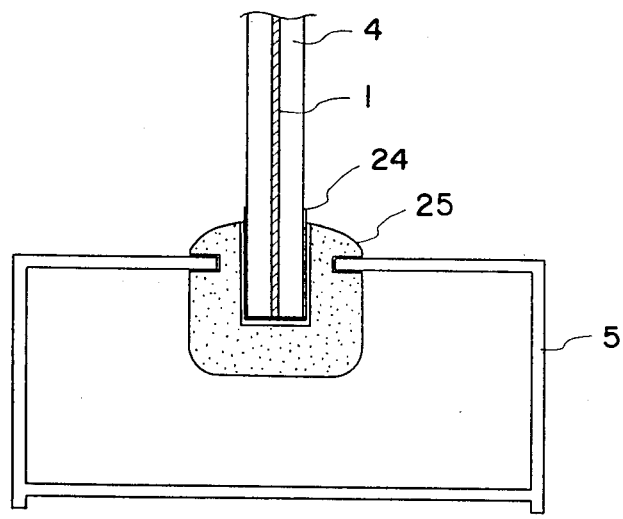
FIGS. 8 and 9 are views illustrating examples in which a window glass is grounded through a sash.

FIG. 8 is a view showing an example in which a window glass is grounded through a sash. A window glass 4 incorporates an electromagnetic shielding body 1 comprising electrically conductive blinds consisting of a mesh or film, and has an electrically conductive paint 24 coating one edge portion thereof. The window glass 4 is secured in the sash 5 via compressed electrically conductive rubber 25. Thus, the electromagnetic shielding body 1 of the window glass 4 is electrically connected to the sash 5 by the electrically conductive paint 24 and electrically conductive rubber 25. Thus, by adopting the embodiment of the invention shown in FIGS. 6 or 7 in which an earth bond is provided between the sash frame and the concrete reinforcing rods of the building body, the window glass is electrically connected to the sash and sash frame, the sash frame is electrically connected to the iron reinforcing rods and the rods are grounded, the window can be electromagnetically shielded more effectively. In particular, in the embodiment where the window glass 4 is fixed by compression of the electrically conductive rubber 25, a sufficient contact pressure is obtained between the electrically conductive paint 24, which is electrically connected to the electromagnetic shielding body 1, and the electrically conductive rubber 25. Similarly, a sufficient contact pressure is obtained between the sash 5 and electrically conductive rubber 25. As a result, contact resistance is reduced to provide sufficient electrical conductivity.

Figure 9:
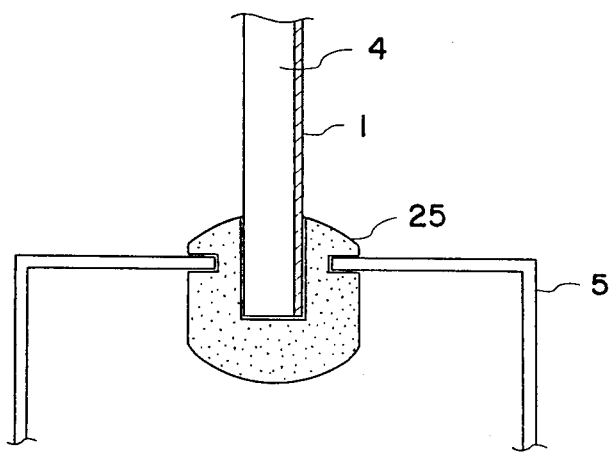

FIG. 9 illustrates still another embodiment of the invention in which an electromagnetic shielding body is formed by vapor-depositing a metal on or affixing an electrically conductive film to the surface of the window glass 4. In this case, the electromagnetic shielding body 1 is provided on the surface of the window glass 4 so that electrical conductivity can be achieved between the electromagnetic shielding body 1 and electrically conductive rubber 25 directly without applying the electrically conductive paint 24, as in the embodiment of FIG. 8.

The inventors have separately proposed structures for electromagnetically shielding the outer wall surface composed of a building body and having openings for windows, entrances, exits and the like. These will now be described in brief. In one approach, the body of the building is constructed of concrete incorporating an electromagnetic shielding member. For example, this can be concrete containing a mesh or concrete mixed with ferrite. In another approach, the outer wall of a building is constructed of PC panels having an imbedded mesh, the mesh in the PC panels is electrically connected to building body fastening members, and the PC panels of upper and lower floors are electrically interconnected and grounded. In still another configuration, curtain walls fabricated using electromagnetic shielding members are fixed by anchor bolts to the building body via metal fasteners, electrically conductive cushions are affixed to the side faces of the curtain walls, and mutually adjacent curtain walls are electrically integrated to form an electromagnetic shielding space.

What we claim is:

1. An electromagnetic shielding structure for a window of a building in which electrically grounded electromagnetic shielding members are used in a body of the building and at openings in the building to provide electromagnetic shielding, said structure for a window comprising:
    a window sash mountable in a window opening of said building so as to be electrically connected to a grounded electromagnetic shielding member;
    window frame means mounted in said window sash, said window frame means being electrically conductive and including two sheets of window glass mounted therein with a space therebetween;
    said window frame means being rotatable with respect to said window sash so as to provide access to the space between said sheets of window glass for insertion thereinto and removal therefrom of an electromagnetic shielding body; and an electromagnetic shielding body removably insertable into said window frame means between said sheets of window glass, said electromagnetic shielding body being electrically grounded to the body of the building via the window frame means when inserted therein.

2. An electromagnetic shielding structure as recited in claim 1 wherein said window frame means including said two spaced sheets of window glass mounted therein is rotatable within said window sash about a pair of oppositely extending shafts, and includes a side opening through which said electromagnetic shielding body is insertable between said spaced sheets of window glass.

3. An electromagnetic shielding structure as recited in claim 2 wherein said electromagnetic shielding body comprises and electrically conductive transparent film.

4. An electromagnetic shielding structure as recited in claim 2 wherein said electromagnetic shielding body comprises a screen sash.

5. An electromagnetic shielding structure as recited in claim 1 wherein said window frame means comprises an inner window frame and an outer window frame each including a sheet of window glass, at least one of said inner and outer window frames being pivotable in said window sash so as to provide an opening through which said electromagnetic shielding body may be inserted into and removed from said space between said two sheets of window glass.

6. An electromagnetic shielding structure as recited in claim 5 wherein said electromagnetic shielding body comprises a transparent electrically conductive film.

7. An electromagnetic structure as recited in claim 5 wherein said electromagnetic shielding body comprises blinds composed of blades forming electromagnetic shielding members.

8. An electromagnetic shielding structure as recited in claim 7, wherein said blinds include blades interconnected by a transparent electrically conductive film, whereby lighting may be adjusted by changing the angle of said blades while said film maintains electromagnetic shielding.

* * * * *